(12) United States Patent
Tekletsadik et al.

(10) Patent No.: US 9,121,879 B2
(45) Date of Patent: Sep. 1, 2015

(54) TECHNIQUES FOR IMPROVING RELIABILITY OF A FAULT CURRENT LIMITING SYSTEM

(75) Inventors: Kasegn D. Tekletsadik, Middleton, MA (US); Paul J. Murphy, Reading, MA (US); Mark R. Amato, Bedford, MA (US); James D. Strassner, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 58 days.

(21) Appl. No.: 13/493,782

(22) Filed: Jun. 11, 2012

(65) Prior Publication Data

US 2013/0221979 A1  Aug. 29, 2013

Related U.S. Application Data

(60) Provisional application No. 61/495,201, filed on Jun. 9, 2011, provisional application No. 61/495,197, filed on Jun. 9, 2011.

(51) Int. Cl.
| | |
|---|---|
| *G01R 31/25* | (2006.01) |
| *G01R 31/00* | (2006.01) |
| *H02H 9/08* | (2006.01) |
| *G01R 33/12* | (2006.01) |
| *H02H 7/00* | (2006.01) |

(52) U.S. Cl.
CPC ............ *G01R 31/00* (2013.01); *G01R 33/1238* (2013.01); *H02H 9/08* (2013.01); *H02H 7/001* (2013.01); *Y02E 40/68* (2013.01)

(58) Field of Classification Search
CPC ...................................................... G01R 31/025
See application file for complete search history.

(56) References Cited

U.S. PATENT DOCUMENTS

| | | | | |
|---|---|---|---|---|
| 3,755,714 | A * | 8/1973 | Link ................................ | 361/67 |
| 4,961,066 | A * | 10/1990 | Bergsjo et al. ................. | 338/325 |
| 5,138,265 | A * | 8/1992 | Kawamura et al. ............ | 324/535 |
| 5,786,705 | A * | 7/1998 | Bui et al. ....................... | 324/762.1 |
| 7,304,826 | B2 * | 12/2007 | Yuan et al. ...................... | 361/19 |
| 2012/0316070 | A1 | 12/2012 | Murphy | |

FOREIGN PATENT DOCUMENTS

| | | | | |
|---|---|---|---|---|
| JP | 01-235842 | * | 9/1989 | ............. G01N 27/20 |

* cited by examiner

*Primary Examiner* — Tung X Nguyen
*Assistant Examiner* — Alesa Allgood

(57) ABSTRACT

Techniques for improving reliability of a superconducting fault current limiting system (SCFCL) are provided. In one particular exemplary embodiment, the technique may be realized as a method of improving a reliability of a superconducting fault current limiting system (SCFCL), the SCFCL system comprising a superconductor provided in a container. The method may comprise providing one or more sensors capable of detecting a fault current proximate to the superconductor; determining a change in the condition of the superconductor as a result of the fault current; and estimating the lifetime of the superconductor based on the change in the condition of the superconductor.

10 Claims, 6 Drawing Sheets

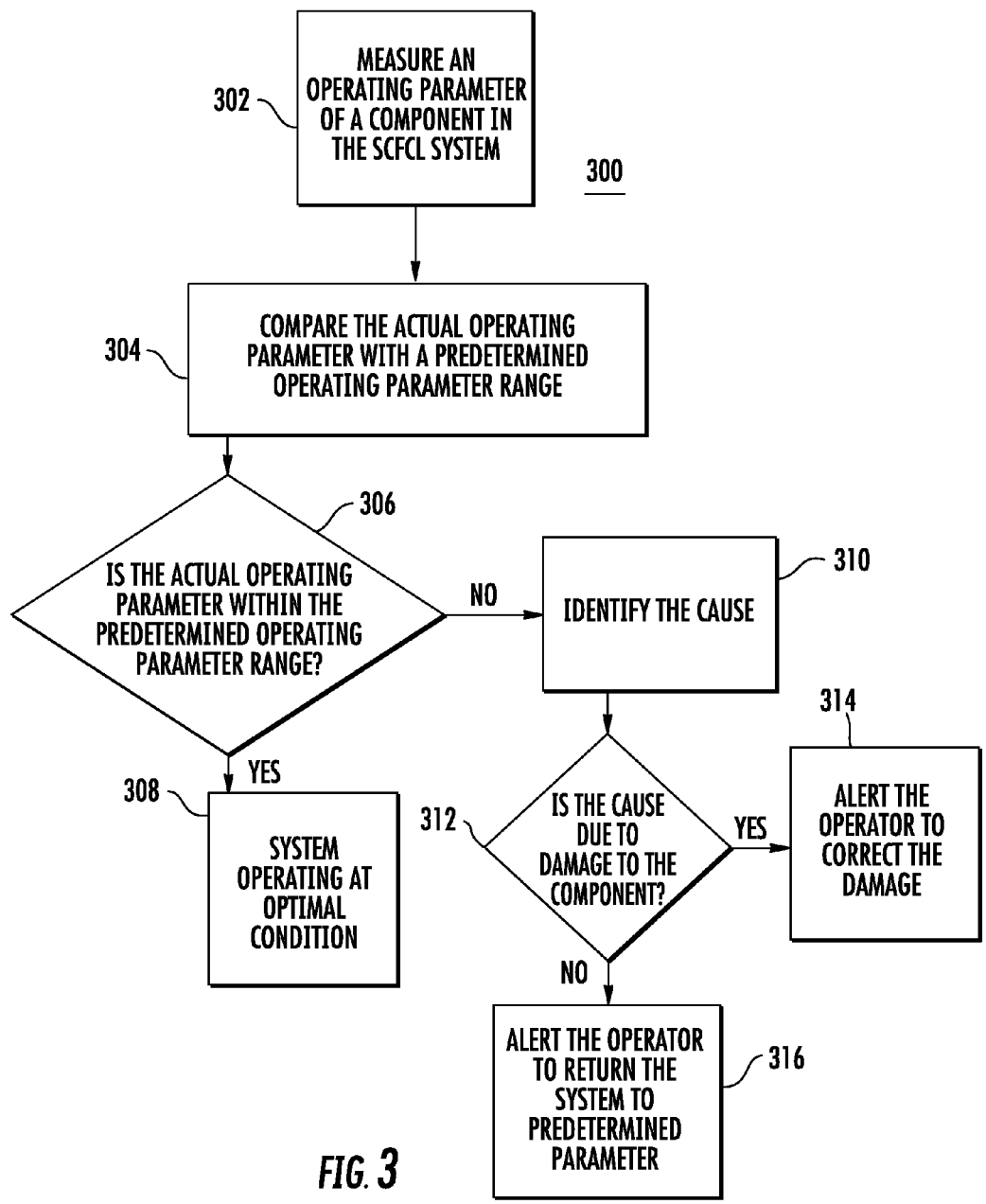

TECHNIQUES FOR IMPROVING RELIABILITY OF A FAULT CURRENT LIMITING SYSTEM

PRIORITY

The present application claims a priority to U.S. Provisional Patent Application Ser. No. 61/495,201, filed on Jun. 9, 2011, entitled "Technique For Improving Reliability Of A Fault Current Limiting System." The present application also claims a priority to U.S. Provisional Patent Application Ser. No. 61/495,197, filed on Jun. 9, 2011, entitled "Technique For Improving Reliability Of A Fault Current Limiting System." Both of the U.S. Provisional Patent Application Ser. No. 61/495,201, and the U.S. Provisional Patent Application Ser. No. 61/495,197 are incorporated herein by reference in entirety.

FIELDS

Present disclosure relates to system for limiting transmission of fault current, more particularly to a technique for improving reliability of a system for limiting transmission of fault current.

BACKGROUND

A fault current is generally defined as a temporary and substantial surge in the current transmitted along a power transmission/distribution network. The fault current may be caused by any number of events, including a lightning strike, downed power lines, or a catastrophic failure of one or more components in the network, which results in localized grounding. When such events occur, a large load appears. The network, in response, may deliver a large amount of current or the fault current to this load. This fault current may exceed the capacity of some of the components in the network and destroy the components. One way to minimize the effect of the fault current is to incorporate a fault current limiter (FCL), which may limit the transmission of the fault current. Ideally, the fault current limiter is fast acting, responding within a few milliseconds of the fault condition. In addition, the current limiter should be self-resetting, allowing normal current to be transmitted after the fault condition subsides.

Examples of FCL may include circuit breakers or fuses. During a fault condition, the circuit breaker mechanically opens the network and disrupts further fault current transmission. This system, although effective, may not be fast acting or self-resetting. In particular, there are significant limits to how fast a circuit breaker can open. In the presence of an inductive load, an arc will develop between the contacts and continue to carry current even after the components are not in contact. Also, the circuit breaker must be closed after the fault condition subsides. If fuses are used, the fuses may have to be replaced manually.

Another example of the conventional FCL is an inductive fault current limiter (IFCL) 100 shown in FIG. 1. The conventional IFCL 100 may comprise first and second steel cores 102a and 102b, an AC circuit 104, and a superconducting circuit 106. As shown in the figure, The AC circuit 104 is wound around the outer limbs of the first and second cores 102a and 102b. Moreover, the superconducting circuit 106 is wound around the inner limb of each core 102a and 102b. Generally, the first and second cores 102a and 102b may be made out of steel or other saturable magnetic materials.

In operation, AC current is transmitted through AC circuit 104. At the same time, DC current flows through the superconducting circuit 106 that is wound around the inner limb of the first and second cores 102a and 102b. During normal conditions, DC current flowing through the superconducting circuit 106 maintains the cores 102a and 102b at magnetic saturation, and minimum inductance will be exhibited by the AC circuit 104. During fault conditions, the fault current flowing through the AC circuit 104 take the cores 102a and 102b out of magnetic saturation. As a result, the AC circuit may exhibit large inductance opposing further increase of the AC current flowing through the AC circuit. Through this process, the transmission of the fault current flowing through the AC circuit 104, and the entire IFCL 100, may be reduced.

Another example of the conventional FCL is a superconducting fault current limiter (SCFCL). Generally, the SCFCL contains a superconducting circuit which is maintained below critical temperature level $T_c$, critical magnetic field level $B_c$, and critical current level $I_c$. In addition, the SCFCL includes a shunt that is in parallel with the superconducting circuit. During normal operation, the SCFCL exhibits almost zero resistivity, and the current from the network is directed to the superconducting circuit and transmitted through the SCFCL with almost zero resistivity. During a fault condition, at least one of the temperature, magnetic field, and current is raised above the critical level. In response, the superconducting circuit is quenched, and the resistance of the circuit and the SCFCL surges. As a result, the fault current is directed to the shunt. As the shunt introduces resistance, a current with much lower amplitude exits the SCFCL. The SCFCL is desirable as the system is fast-acting and self-resetting after the fault condition.

Among others, the reliability is an important requirement of any fault current limiting systems. Any defects in the systems may prevent transmission of normal current during normal conditions, making the system highly inefficient. The defects may also prevent the systems from effectively limiting the transmission of a fault current. Accordingly, a new technique for improving reliability of fault current limiting system is needed.

SUMMARY

Techniques for improving reliability of a superconducting fault current limiting system (SCFCL) are provided. In one particular exemplary embodiment, the technique may be realized as a method of improving a reliability of a superconducting fault current limiting system (SCFCL), the SCFCL system comprising a superconductor provided in a container. The method may comprise providing one or more sensors capable of detecting a fault current proximate to the superconductor; determining a change in the condition of the superconductor as a result of the fault current; and estimating the lifetime of the superconductor based on the change in the condition of the superconductor.

In accordance with other aspects of this particular exemplary embodiment, the change in the condition of the superconductor may comprise an increase in the number of hotspots in the superconductors as a result of the encountered fault current.

In accordance with further aspects of this particular exemplary embodiment, the method may further comprise analyzing one or more properties of the fault current that caused the increase in the number of hotspots in the superconductors as a result of the encountered fault current.

In accordance with additional aspects of this particular exemplary embodiment, the method may further comprise comparing, prior to the estimating the lifetime, a number of hotspots in the superconductor after the encountered fault current and a predetermined number.

In accordance with further aspects of this particular exemplary embodiment, the method may further comprise replacing the superconductor if the number of hotspots in the superconductor after the encountered fault current is greater than the predetermined number.

In accordance with additional aspects of this particular exemplary embodiment, the lifetime may comprise a number of one or more additional fault currents the superconductor can encounter without a failure.

In accordance with further aspects of this particular exemplary embodiment, the method may further comprise replacing the superconductor if the lifetime is less than 1 additional fault current.

In accordance with additional aspects of this particular exemplary embodiment, the one or more properties of the fault current may comprise an energy of the fault current that increases the temperature of the superconductor.

In accordance with other aspects of this particular exemplary embodiment, the one or more properties of the fault current may comprise an energy of the fault current that change a number of hotspots in the superconductors.

In accordance with further aspects of this particular exemplary embodiment, the one or more sensors may be one or more temperature sensors.

In accordance with additional aspects of this particular exemplary embodiment, the one or more temperature sensors may be a plurality of temperature sensors provided near different regions across the superconductor.

In accordance with further aspects of this particular exemplary embodiment, the method may further comprise counting a number of fault current encountered by the superconductor.

In accordance with another exemplary embodiment, the technique may be realized as a method of improving a reliability of a superconducting fault current limiting system (SCFCL), the SCFCL system comprising a superconductor provided in a container. The method may comprise providing one or more sensors proximate to the superconductor capable of detecting a plurality of fault currents encountered by the superconductor; counting a number of fault currents encountered by the superconductor; analyzing one or more properties of each fault current encountered by the superconductor; determining one or more changes in the condition of the superconductor as a result of each fault current; and estimating the lifetime of the superconductor based on the changes in the conditions of the superconductor and properties of prior fault currents.

In accordance with other aspects of this particular exemplary embodiment, the one or more sensors are one or more temperature sensors.

In accordance with further aspects of this particular exemplary embodiment, the one or more temperature sensors are a plurality of temperature sensors provided near different regions across the superconductor.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE FIGURES

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 3 illustrates an exemplary method for improving the reliability of SCFCL according one embodiment of the present disclosure.

DETAILED DESCRIPTION

Herein several embodiments of a novel technique for improving reliability of a system for limiting transmission of fault current are disclosed. The technique may be used to check the health of one or more components in a fault current limiting system. In addition, the technique may be used to predict the lifetime of the components. Herein, the term "lifetime" may refer to as additional fault current a component in the fault current system may encounter without failing. For the purpose of clarity and simplicity, the present disclosure may focus on a superconductor fault current limiter (SCFCL). Those of ordinary skill in the art will recognize that the embodiments included in the present disclosure are for illustrative purpose only and that the embodiments may be equally applicable to other types of systems for limiting transmission of a fault current. Other types of systems for limiting transmission of a fault current may include an inductive fault current limiter, as described earlier, a solid state fault current limiter (SSFCL), and others.

Figure 1:
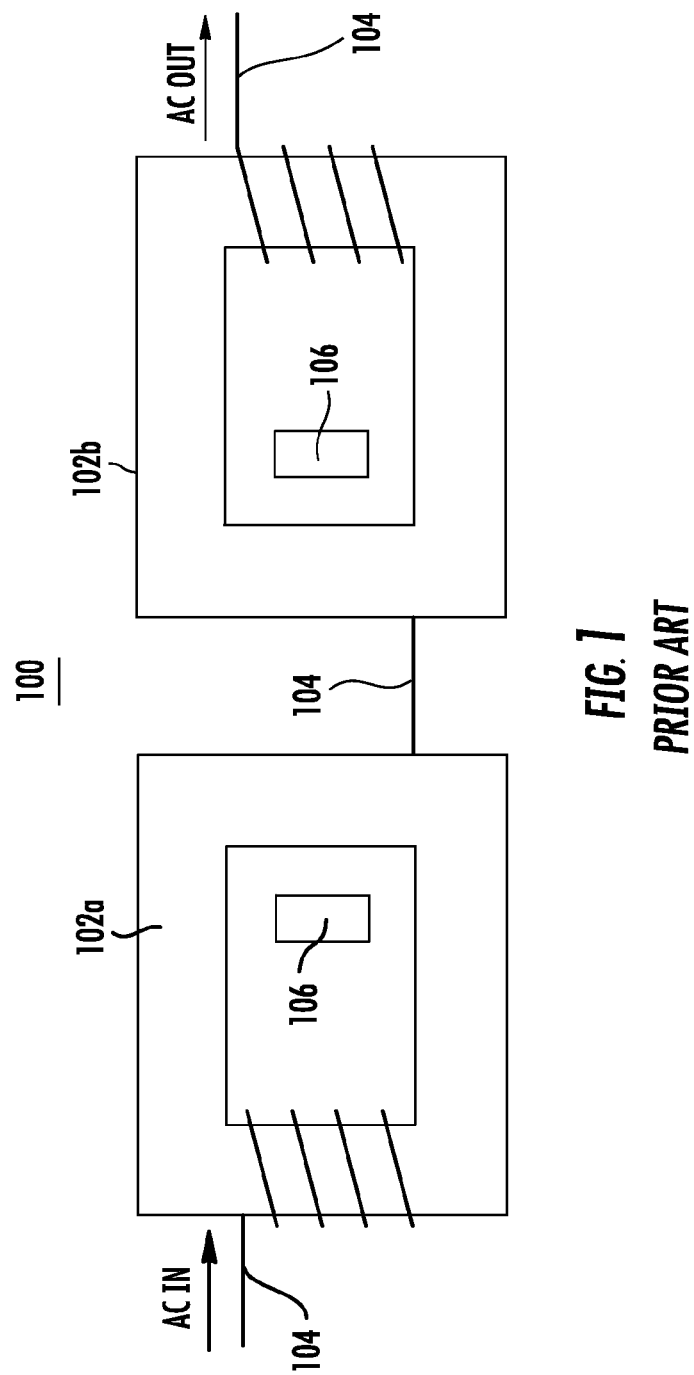
FIG. 1 illustrates a conventional inductive fault current limiter.
Figure 1A:
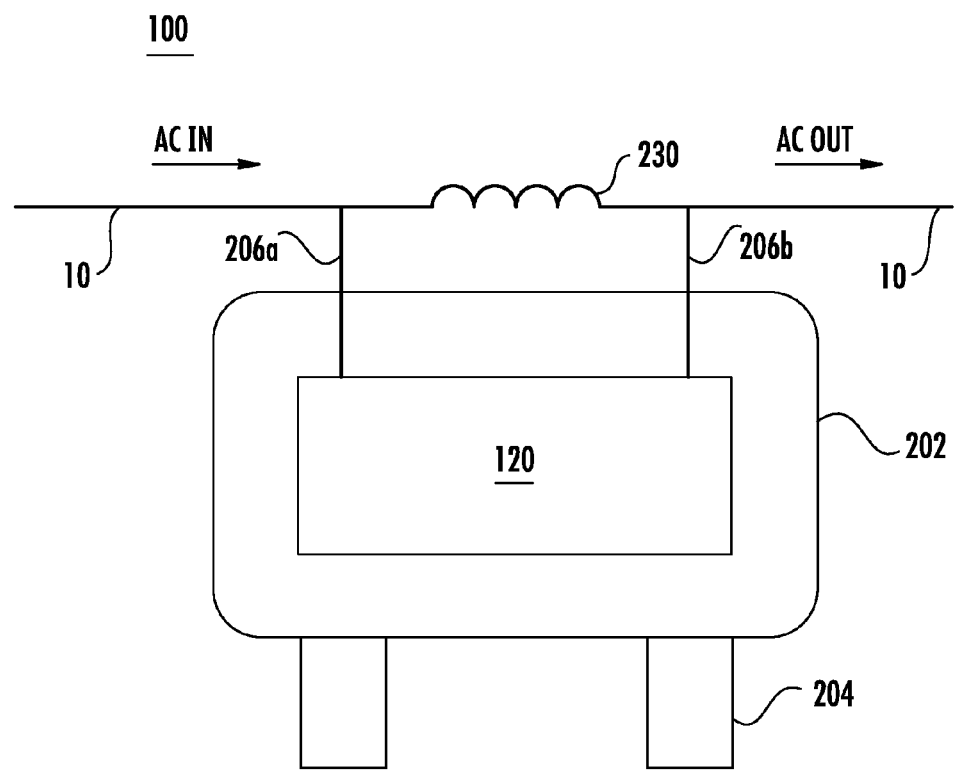
Figure 1B:
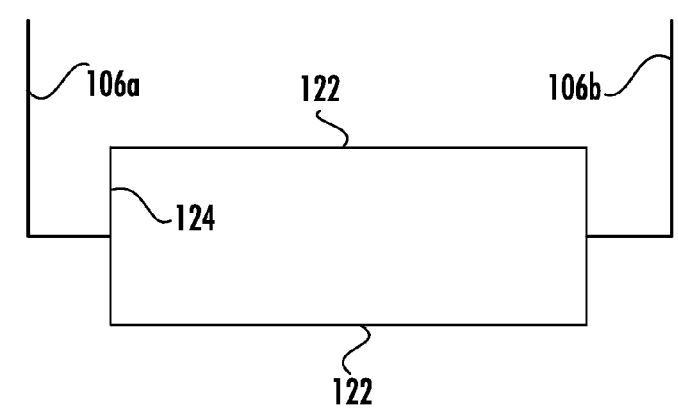
Figure 2A:
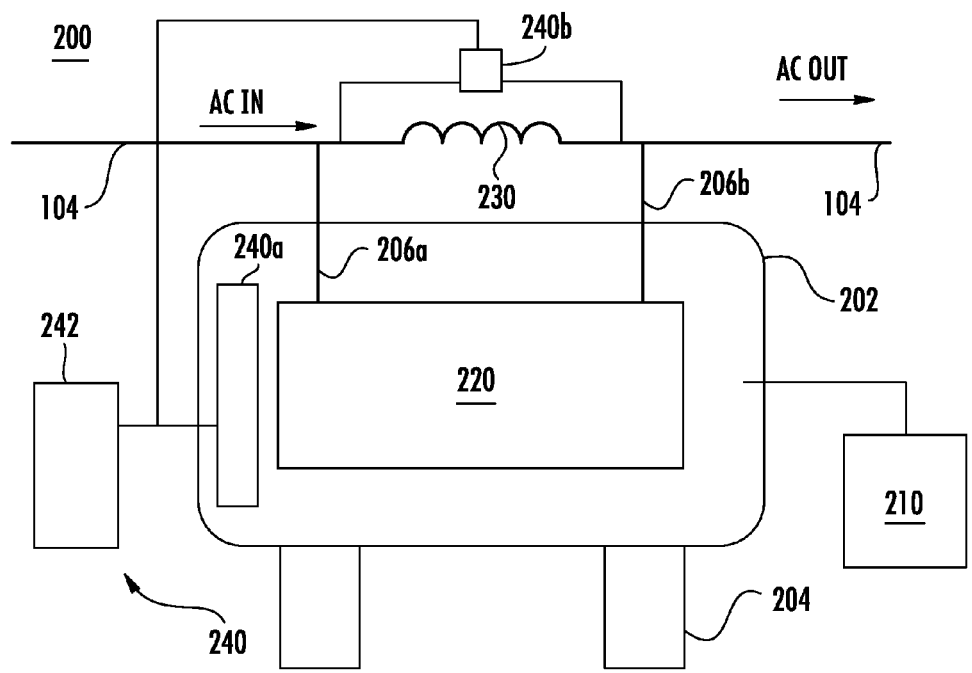
FIG. 2a-2c illustrate a superconducting fault current limiter (SCFCL) with a monitoring system to improve reliability according to one embodiment of the present disclosure.
Figure 2B:
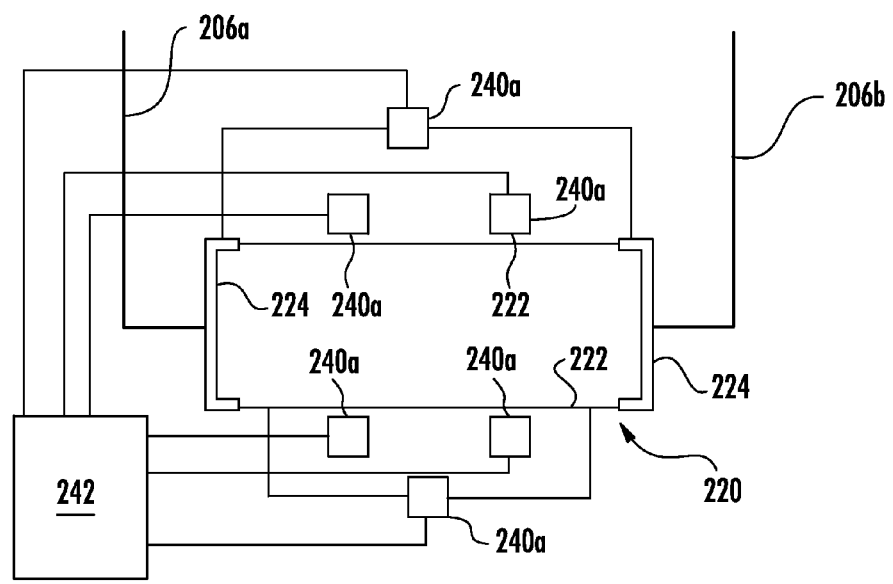
Figure 2C:
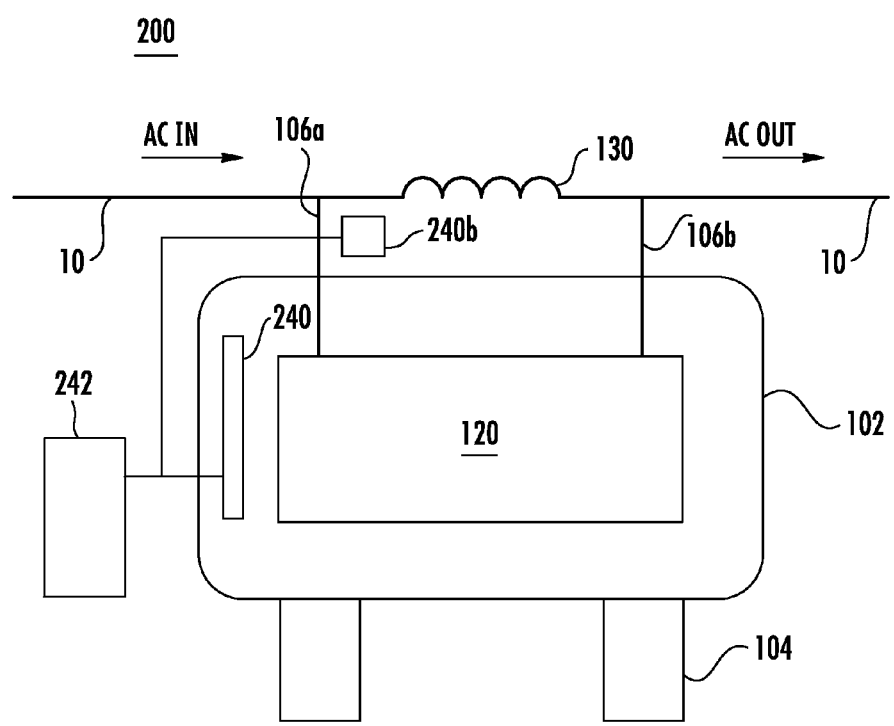

Referring to FIG. 2, there is shown an exemplary SCFCL system 200 according to one embodiment of the present disclosure. The SCFCL system 200 may comprise a container 202 supported by a support 204. The SCFCL system 200 may also comprise input/output current leads 206a and 206b that electrically couple the SCFCL system 200, and/or components therein, to the transmission/distribution network via the network cable 104. In particular, current may be introduced into the SCFCL 200 via the input current lead 206a and exit the SCFCL system 200 via the output current lead 206b.

Within the container 202, a superconducting circuit 220 may be disposed. The superconducting circuit 220 may be electrically coupled to the network cable 10 via the input and output current leads 206a and 206b. The superconducting circuit 220 may be immersed in coolant, in gaseous or liquid form, which is used to maintain the superconducting circuit 220 at a desired temperature. An example of the coolant may be liquid nitrogen. However, other types of coolant may be used as the coolant. The coolant may be provided into the container from a cryogenic system 210. Outside the container 202, there may be a shunt 230 that is in parallel with the superconducting circuit 220.

The superconducting circuit 220 may comprise two or more superconductors 222 disposed in parallel, and connected to one another by a connector 224. In the present disclosure, each superconductor 222 may be in a form of the tape, wire, cable, etc. . . . . Although two or more superconductors 222 are preferred, the present disclosure does not preclude the superconducting circuit 120 from comprising a single superconductor 222. In addition, the present disclosure does not preclude two or more superconductors 222 being connected to one another in series, with or without the connectors 224 therebetween.

The container 202, meanwhile, may be made from an electrically conducting material. However, the present disclosure does not preclude the container 202 being made from electrically insulating or dielectric material. The container 202 may be maintained at a ground potential or a non-ground potential. In one example, the container 202 may be electrically connected to the ground. In other embodiments, the container 202 may be electrically connected, either directly or indirectly, to the network cable 10 and maintained at live potential. Yet in other embodiments, the container 202 may be electrically floating. Depending on the desired voltage of the container 202, the support 204 may also be made from electrically conducting or electrically non-conducting material.

As illustrated in FIGS. 2a and 2b, the SCFCL system 200 may also comprise a monitoring system 240. The monitoring system 240 may comprise one or more sensors 240a disposed at different locations inside and/or outside the container 202. Each sensor 240a may be proximate to different components in the SCFCL system 200 including the superconductors 222 and the connectors 224 of the superconducting circuit 220, and the shunt 230. The sensors 240a may be connected or spaced apart from the components in the SCFCL system 200. Although not shown, there may be one or more sensors proximate to, being in contact or spaced apart from, the cryogenic system 210 and each of the input/output current leads 206a and 206b. In addition, the monitoring system 240 may comprise a controller 242 that is coupled to the sensors 240a and that collects data from one or more sensors 240a. In the present embodiment, the sensors 240a collect data on the operating parameters/conditions associated with each component to determine the health or estimate the lifetime of each component in the SCFCL system 200.

In the present disclosure, various types of sensors 240a may be used. Examples of the sensors 240a may include the current transducers, the voltage meters, the pressure sensors, the cryogen level sensor, the temperature sensors, Gauss meter, etc. . . . or a combination thereof. The data collected by the sensors 240a may include the voltage, pressure, temperature, magnetic field, acoustic signature, vibration and displacement of the component, presence of bubbles forming near the superconductors 222. The sensors 240a may collect the data using visual, acoustic, electrical means, or other means to monitor the parameters or conditions.

Hereinafter, several exemplary operations of the monitoring system 240 are provided. Those of ordinary skill in the art will recognize that the present disclosures are not limited thereto. In one example, the monitoring system 240 may comprise at least one of the sensors 240a contained in the container 202 as shown in FIG. 2a. The sensor 240a may measure the temperature within the container 202 at a given time, and provide the measured temperature to the controller 242. The controller 242 may determine if the temperature within the container 202 is above $T_c$ of the superconductors 222. If the controller 242 determines that the temperature is above $T_c$, the controller 242 may determine that the cryogenic system (not shown) is operating at less than optimal efficiency. The controller 242 may then notify the operator of the SCFCL system 200 to fix or replace the cryogenic system.

In another example, the monitoring system 240 may comprise a plurality of sensors 240a proximate to the different regions of at least one of the superconductors 222, as shown in FIG. 2b. The sensors 240a may measure the temperature near different regions across the superconductor 222 and provide the measured temperatures to the controller 242. Based on the measured temperature, the controller 242 may determine the presence of temperature variations across the superconductor 242. Extreme variations may be indicative of the presence of hotspots or defects on the superconductor 222. If the controller 242 determines that the number of hotspots exceeds a predetermined value, the controller 242 may notify the operator of the SCFCL system 200 to replace the superconductor 222.

In another example, the monitoring system 240 may include at least one additional detector capable of measuring the pressure inside the container 202. Based on the pressure measured by the detector, the controller 242 may determine possible leakage in the container 202 or a faulty cryogenic system. In another example, the monitoring system 240 may include at least one additional detector capable of detecting the bubbles formed near the superconductors 222. In this example, the detectors may detect the bubbles via, for example, optical or acoustic means. However, the detector may detect the bubbles via other means. As the excessive formation of the bubbles may be attributable to hotspots or other defects in the superconductors 222, the sensor, along with the controller 242, may determine the presence of faulty superconductors 222.

Yet in another example, the monitoring system 240 may include at least one additional detector capable of monitoring or detecting the change in the magnetic field around the superconductors 222. The monitoring system 240 may also include at least one additional sensor capable of detecting the vibration of the superconductors 222, or displacement of the superconductors within the container 202. If the vibration or displacement of the superconductors 222 is excessive, the controller 242 may alert the operator to fasten the superconductors 222 or correct the position of the superconductors 222. Further, the monitoring system 240 may include one or more sensors 240a that are in contact with the superconductors 222, the connector 224 supporting the superconductors 222, or the shunt. Such sensors 240a may detect a voltage drop across an individual superconductor 222, the superconducting circuit 220, and the shunt 230. A voltage drop across any one of an individual superconductor 222, the superconducting circuit 220, and the shunt 230 may be indicative of at least one defective superconductor 222. The sensors 240a may also measure the peak current transmitted through the superconductors 222 to determine the health of the superconductors 222.

In the present disclosure, the monitoring system 240 may also detect variations, either gradual or sudden, in the operating parameters associated with a component over a period of time. Using the earlier example of the monitoring system 240, at least one sensor 240a disposed near a superconductor 222 may continually measure the temperature near the superconductors 222. A substantial increase in the temperature near the superconductor 222 may indicate an excessive number of hotspots or defects. Upon determining an unacceptable number or level of defects, the controller 242 may notify the operator of the SCFCL system 200 of such a change and instruct the operator to replace the superconductor 222.

In another example, the monitoring system 240 may also detect and analyze the number and properties of the fault current to which the SCFCL system 200 is exposed. Such information may be used to detect the health of the components in the SCFCL system 200. In addition, the information may be used to estimate the lifetime of the components. Using the earlier example, the sensors 240a may detect one or more sudden changes in the temperature of at least one superconductor 222. The sensors 240a may also collect information pertaining to the properties of the encountered fault current. For example, the sensors 240a may collect information pertaining to the period during which the temperature 240a of the superconductor 222 is raised. Moreover, the sensors 240a may also collect the magnitude of the increased temperature. The data collected by the sensor 240a is provided to the controller 242. The controller 242 may then determine the number of fault currents encountered by the SCFCL system 200. In addition, the controller 242 may analyze properties of each fault current encountered by the SCFCL system 200. The controller 242 may then determine whether the superconductors 222 had withstood and survived the fault current. If the controller 242 determines that the superconductors 222 had survived, the controller 242 may estimate the lifetime of the superconductors 222 based on the collected data. If the controller deems that the lifetime of the superconductor 222 is less than 1, the controller 242 may notify the operator of the SCFCL system 200 replace the superconductors 222.

Those ordinary skilled in the art will recognize that the above examples focus on using the monitoring system 240 with temperature detectors 240a. The monitoring system 240 however may also comprise other sensor capable of measuring/sensing other parameters. Such sensors may be used by themselves or in conjunctions with the temperature detectors 240a to accurately determine the properties of the fault current and estimate the lifetime of the superconductors 222.

Referring to FIG. 3, there is shown a flow chart of a method 300 for monitoring the health and estimating the lifetime of a SCFCL system according to one embodiment of the present disclosure. For the purpose of clarity and simplicity, the method 300 of the present embodiment may be described in context to the SCFCL system 200 shown in FIG. 2. In addition, the method 300 may be provided, for clarity and simplicity, using one or more sensors 240a capable of collecting temperature data. However, those of ordinary skill in the art will recognize that other sensors capable of collecting data on other operating parameters, such as the pressure, may also be used.

As illustrated in step 302, at least one sensor 240a in the container 202 may measured the temperature associated with a component therein (e.g. superconductor 222). In step 304, the measured, actual temperature is provided to the controller 242, and the controller 242 may compare the measured temperature and a predetermined, optimal temperature inside the container 202. The predetermined temperature may be the temperature below $T_c$ of the superconductor 222. If the controller 242 determines, in step 306, that the actual temperature is within a predetermined value range (e.g. below $T_c$), the controller 308 may determined that the cryogenic system is operating at optimal condition. Otherwise, the cause of non-optimal operation of the cryogenic system 310 is identified in step 310.

If the cause is determined, in step 310, to be the result of damaged cryogenic system, the controller 242 may notify the operator of the SCFCL system 200 to replace or repair the faulty cryogenic system in step 314. Otherwise, as shown in step 316, the controller 242 may notify the operator to adjust the cryogenic system such that temperature within the container 202 may return to a temperature below $T_c$. For example, the controller 242 may determine that the cause of the actual temperature inside the container 202 being above $T_c$ may be due to depletion of the coolant. In such a case, the controller 242 may alert the operator to replenish the coolant.

Figure 4:
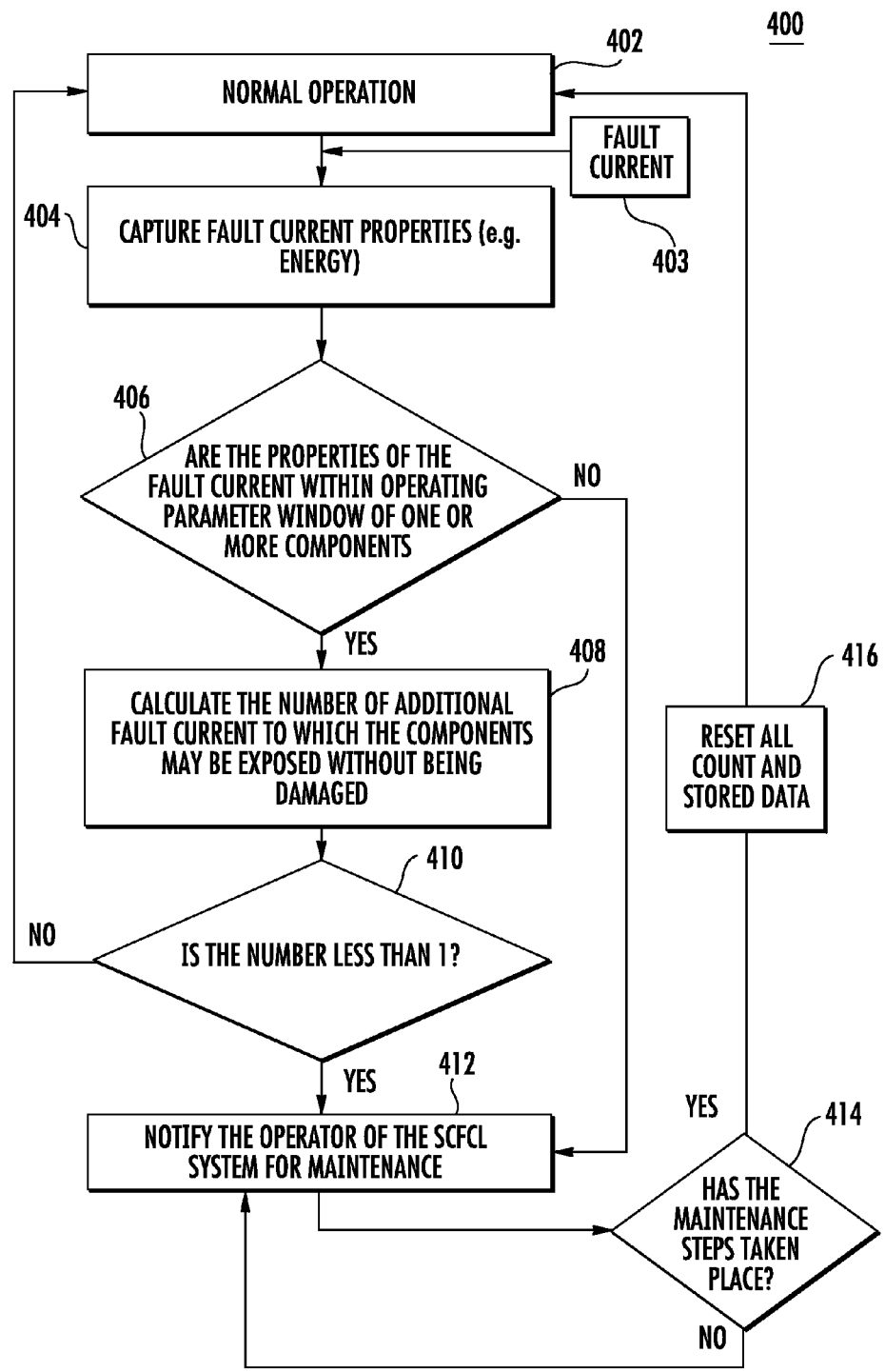
FIG. 4 illustrates another exemplary method for improving reliability of SCFCL according to another embodiment of the present disclosure.

Referring to FIG. 4 there is shown a flow chart of a method 400 for monitoring the health and estimating the lifetime of a SCFCL system according to another embodiment of the present disclosure. For clarity and simplicity, the method 400 may be provided in context to monitoring the health and estimating the lifetime of one or more superconductors 222 in the SCFCL system 200 shown in FIG. 2. Accordingly, the component described in FIG. 4 may be the superconductors 222.

As illustrated in FIG. 4, SCFCL system 200 may operate during normal conditions, as shown in step 402. When a fault current occurs, as illustrated in step 403, the properties of the fault current (e.g. energy, current level, the fault current duration, etc. . . . ) may be measured, directly or indirectly, by one or more sensors 240a of the monitoring system 240 in step 404. For example, an increase in the temperature of the superconductors 222 in response to the fault current may be measured by the sensors 240a, and the information may be sent to the controller 242. The controller 242 may then determine the properties of the fault current. In step 406, the controller 242 may determines if the properties of the fault current are within the operating window of the superconductor 222. If so, the controller 242 may conclude that the superconductors 222 may have withstood the fault current, and the method 400 may proceed to step 408. Otherwise, the method 400 may proceed to step 412, during which the operator of the SCFCL system 200 is notified to perform a maintenance procedure on the superconductors 222. In the present embodiment, the maintenance procedure may include replacing the existing superconductors 222 with new superconductors 222.

In step 408, the controller 242 may estimate the lifetime of the superconductors 222 based on the properties of past fault currents. If the controller 242 estimates, in step 410, that the lifetime of the superconductor 222 is less than 1 additional fault current, the method may proceeds to step 412, during which the operator of the SCFCL system 200 is notified to perform the maintenance procedure. For example, the controller 242 may determine the increase in hotspots in the superconductor 222 as a result of the fault current. If the hotspots exceed a predetermined level, the controller 242 may determined that superconductor 242 is damaged and may not survive additional fault currents. The controller 242 may then notify the operator to replace the superconductor 222. However, if the hotspots in the superconductor 222 are determined to be below the predetermined level, the controller 242 may determine that the superconductor 222 may survive additional fault currents and the lifetime of the superconductor 222 to be greater than 1. The method 300 of the present embodiment may then return to step 402.

After notifying the operator of the SCFCL system 200 to perform the maintenance procedure in step 412, the controller 422 may confirm if the maintenance step has actually taken place in step 414. If the maintenance procedure is confirmed, the controller 242 resets all count and stored data in step 416. Otherwise, the method 400 returns to step 412 until the maintenance procedure takes place.

Several embodiments of a technique for improving reliability of a system for limiting transmission of fault current are disclosed. Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for improving a reliability of a superconducting fault current limiting system (SCFCL), the SCFCL system comprising a superconductor provided in a container, the method comprising:
providing one or more sensors capable of detecting a fault current proximate to the superconductor;
determining a change in the condition of the superconductor as a result of the fault current, wherein the change in the condition of the superconductor comprises an increase in the number of hotspots in the superconductors as a result of the encountered fault current;
estimating the lifetime of the superconductor based on the change in the condition of the superconductor;
comparing, prior to the estimating the lifetime, a number of hotspots in the superconductor after the encountered fault current and a predetermined number, wherein the lifetime comprises a number of one or more additional fault currents the superconductor can encounter without a failure; and
replacing the superconductor if the lifetime is less than 1 additional fault current.

2. The method according to claim 1, further comprising:
counting a number of fault current encountered by the superconductor.

3. The method according claim 1, further comprising:
analyzing one or more properties of the fault current that caused the increase in the number of hotspots in the superconductors as a result of the encountered fault current.

4. The method according to claim 3, wherein the one or more properties of the fault current comprises an energy of the fault current that increases the temperature of the superconductor.

5. The method according to claim 3, wherein the one or more properties of the fault current comprises an energy of the fault current that change a number of hotspots in the superconductors.

6. The method according to claim 3, wherein the one or more sensors are one or more temperature sensors.

7. The method according to claim 6, wherein the one or more temperature sensors are a plurality of temperature sensors provided near different regions across the superconductor.

8. A method for improving a reliability of a superconducting fault current limiting system (SCFCL), the SCFCL system comprising a superconductor provided in a container, the method comprising:
providing one or more sensors proximate to the superconductor capable of detecting a plurality of fault currents encountered by the superconductor;
counting a number of fault currents encountered by the superconductor;
analyzing one or more properties of each fault current encountered by the superconductor;
determining one or more changes in the condition of the superconductor as a result of each fault current; and
estimating the lifetime of the superconductor based on the changes in the conditions of the superconductor and properties of prior fault currents; and
replacing the superconductor if the lifetime is less than 1 additional fault current.

9. The method according to claim 8, wherein the one or more sensors are one or more temperature sensors.

10. The method according to claim 9, wherein the one or more temperature sensors are a plurality of temperature sensors provided near different regions across the superconductor.

* * * * *